United States Patent [19]

Champlin

[11] Patent Number: 5,598,098
[45] Date of Patent: Jan. 28, 1997

[54] ELECTRONIC BATTERY TESTER WITH VERY HIGH NOISE IMMUNITY

[76] Inventor: Keith S. Champlin, 5437 Elliot Ave. South, Minneapolis, Minn. 55417

[21] Appl. No.: 289,302

[22] Filed: Aug. 11, 1994

[51] Int. Cl.$^6$ .......................... G01R 31/36; G01N 27/04; G01N 27/416
[52] U.S. Cl. .............. 324/430; 324/710; 320/48
[58] Field of Search .................. 320/48; 324/426, 324/430, 427, 428, 436, 710, 712; 340/636

[56] References Cited

U.S. PATENT DOCUMENTS

| | | | |
|---|---|---|---|
| 3,676,770 | 7/1972 | Sharaf et al. | 324/436 |
| 3,873,911 | 3/1975 | Champlin | 324/29.5 |
| 3,909,708 | 9/1975 | Champlin | 324/29.5 |
| 3,984,768 | 10/1976 | Staples | 324/551 |
| 4,697,134 | 9/1987 | Burkum et al. | 320/48 |
| 4,816,768 | 3/1989 | Champlin | 324/428 |
| 4,825,170 | 4/1989 | Champlin | 324/436 |
| 4,881,038 | 11/1989 | Champlin | 324/426 |
| 4,912,416 | 3/1990 | Champlin | 324/430 |
| 5,047,722 | 9/1991 | Wurst et al. | 324/434 |
| 5,140,269 | 8/1992 | Champlin | 324/433 |
| 5,343,380 | 8/1994 | Champlin | 363/46 |

FOREIGN PATENT DOCUMENTS

WO93/22666  11/1993  European Pat. Off. .

OTHER PUBLICATIONS

"Determining the End of Battery Life," Sheldon DeBardelaben, Intelec 86, month unavailable, *IEEE* Publication CH 2328–Mar. 1986/0000–3365, pp. 365–368.

"A Look at the Impedance of a Cell," S. L. DeBardelaben, Intelec 88, month unavailable, *IEEE* Publication CH 2653–Apr. 1988/0000, 0394, pp. 394–397.

"Farads, Milliohms, Microhenries," E. Wilinganz et al, *Electrical Engineering*, vol. 78, No. 9, Sep. 1959, pp. 922–925.

*Primary Examiner*—Kenneth A. Wieder
*Assistant Examiner*—Glenn W. Brown
*Attorney, Agent, or Firm*— Westman, Champlin & Kelly, P.A.

[57] ABSTRACT

A cell/battery is excited by a time-varying signal that is characterized by periodically making step transitions between discrete levels. The immediate change in a responsive signal is determined by a circuit that is only enabled during a brief "window" of time encompassing a step transition, and which employs a "holding capacitor" to store dynamic conditions existing at the instant of enablement. Action of this "holding capacitor" causes the circuit to only respond to changes in noise signals occurring during the enablement "window" and not to the actual level of the noise itself. By making the "window" sufficiently narrow, noise signals can change by only an acceptably small amount and can be removed by synchronously detecting the response to the step excitation and averaging the result over time. Two embodiments are disclosed. A first embodiment utilizes a step current-signal excitation and a voltage-signal response to directly determine a particular component of incremental resistance. A second, preferred, embodiment utilizes a step voltage-signal excitation and a current-signal response to directly determine a particular component of incremental conductance.

12 Claims, 11 Drawing Sheets

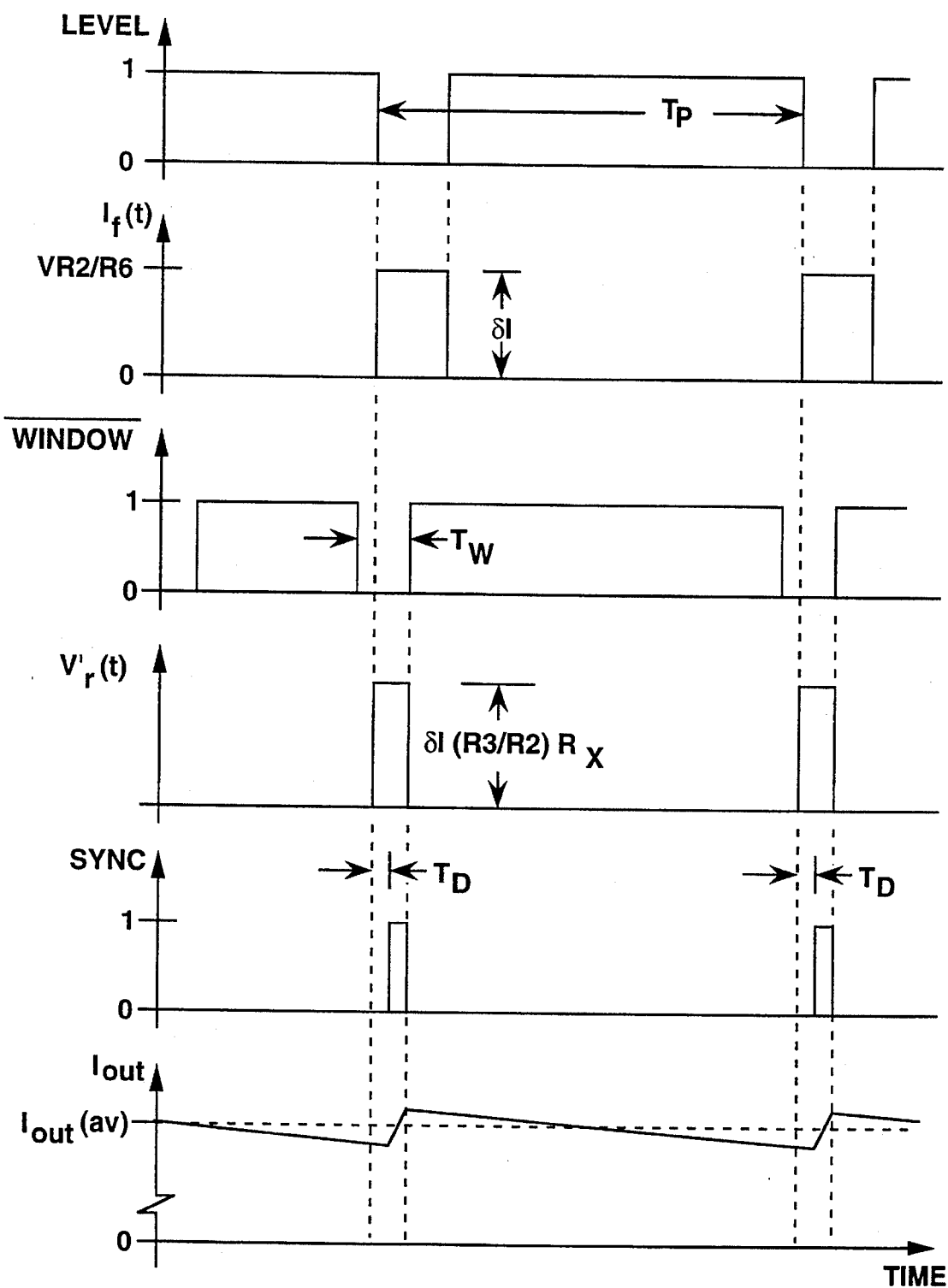

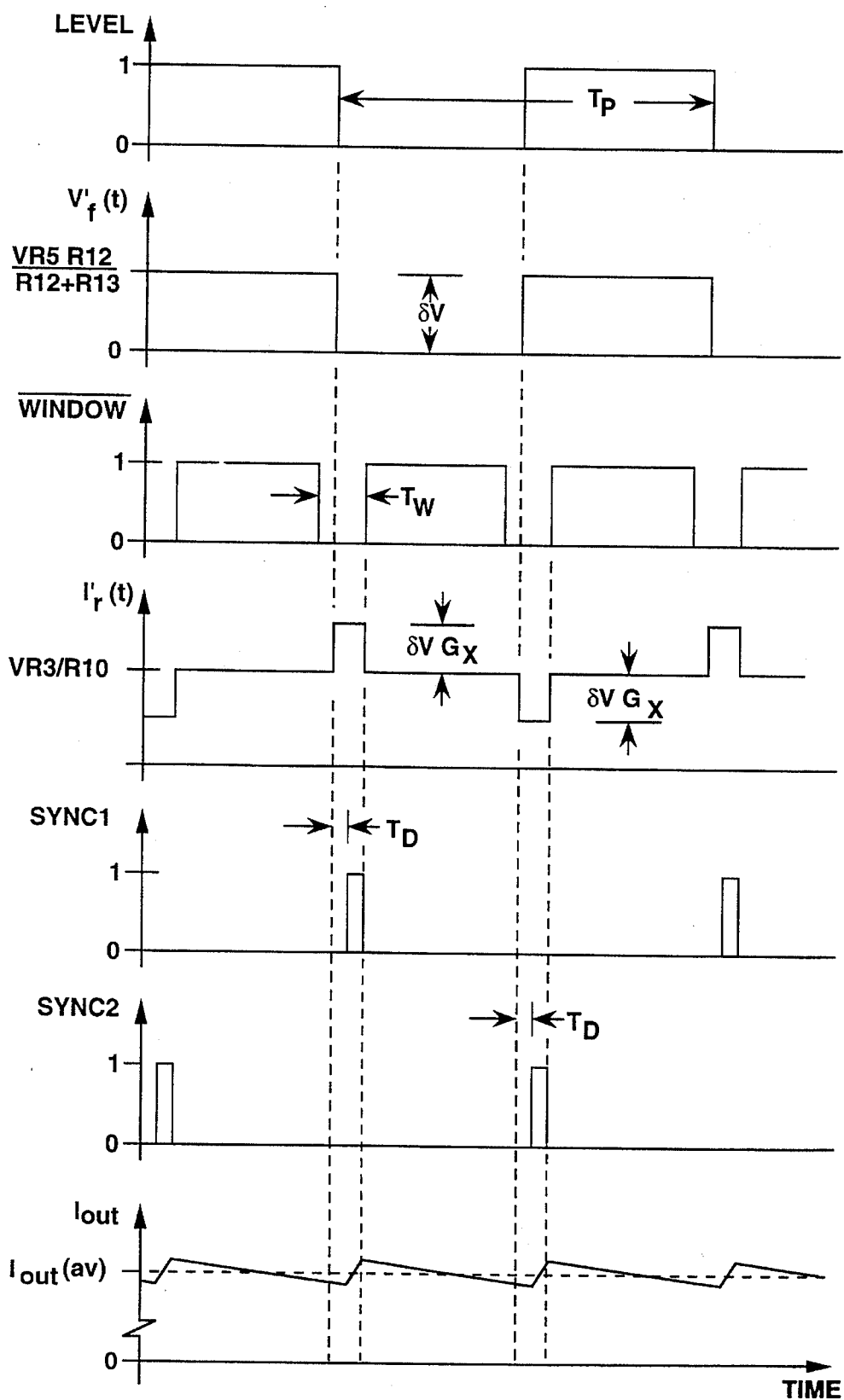

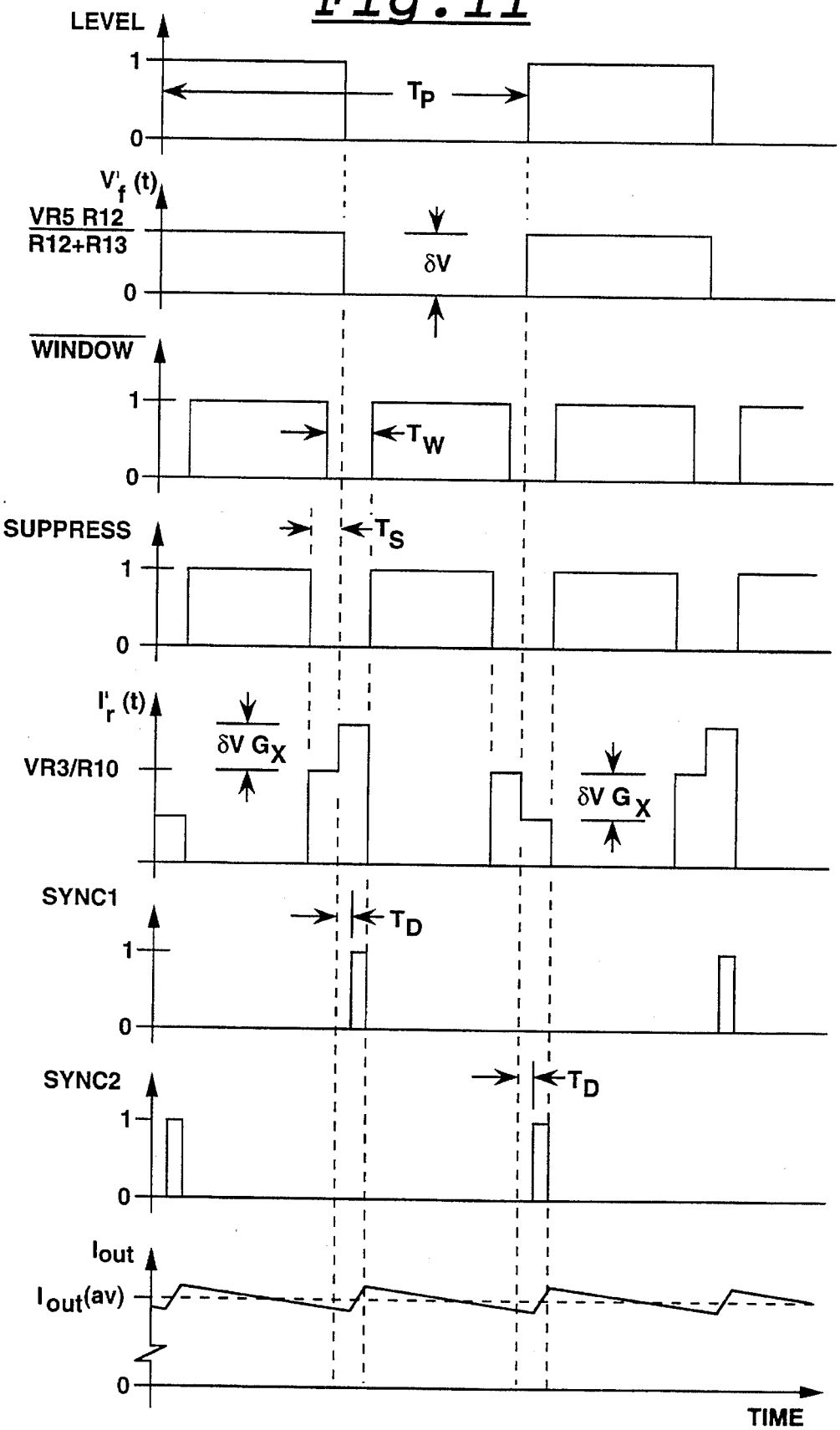

ELECTRONIC BATTERY TESTER WITH VERY HIGH NOISE IMMUNITY

BACKGROUND OF THE INVENTION

This invention relates generally to a method and apparatus for electronically assessing the condition of an electrochemical cell or battery while it is in the process of being charged or of supplying power to an active load. More particularly, it relates to special "noise-immune" circuitry for measuring a particular component of a cell/battery's incremental conductance or resistance—a component that has been found by the present inventor to be closely related to the cell/battery's cranking power and energy capacity. Using principles disclosed herein, these measurements can be performed in the presence of very large, time-varying, "noise" signals such as those introduced by alternators, unfiltered chargers, and continuously-switching loads.

Because of its high degree of noise immunity, the disclosed invention can be used to assess the condition of an automotive battery while it is actually being charged by the car's alternator; of an electric vehicle's propulsion battery while the vehicle is being driven; or of the cells of a stationary battery—a battery of the type employed in a telephone central office or an uninterruptible power system (UPS)—while the battery is "on line." The disclosed principles can be advantageously utilized in a variety of applications such as, e.g., a dashboard mounted instrument (e.g., an electric car's "fuel gauge"), a portable hand-held test instrument, or a permanently installed system for remotely monitoring a group of stationary cells.

In order to measure incremental resistance or impedance, one passes a time-varying current through a cell/battery and observes an appropriate component of the resulting time-varying voltage developed across it. Incremental conductance is measured in the opposite manner. One places a time-varying voltage across a cell/battery and observes the appropriate component of time-varying current passing through the cell/battery. In either type of measurement, a problem arises if there are already time-varying currents and voltages (i.e., "noise") present. Such signals, when present during measurement, can degrade accuracy and may introduce serious errors by causing amplifier saturation. Unfortunately, spurious time-varying signals are common occurrences for cells/batteries undergoing either "float" or high-rate charging, or supplying power to an "active" load. Under such circumstances, time-varying battery currents frequently result from imperfect filtering of the battery charger's rectifier or from fluctuations in the current drawn by the load.

One approach to solving the problem of noise introduced by a charger or load is to simply remove the battery from service during measurement of its incremental parameters. This has, in fact, been done innumerable times with satisfactory results. Many cases arise, however, in which it is not desirable or even feasible to take the cell/battery "off line."

A second approach is described in the prior art and is the approach followed by DeBardelaben (S. DeBardelaben, "Determining the End of Battery Life", INTELEC 86, Toronto, Canada, pp. 365–368), as well as by Burkum and Gabriel in U.S. Pat. No. 4,697,134. Their approach is to choose the measurement frequency to be different from any frequencies that are otherwise present in the charger/load circuit and to then use filters to separate the measuring signal from the spurious signals. This solution to the problem is likewise not entirely satisfactory since it assumes prior knowledge of the spurious signal frequencies and requires that the measurement frequency be dictated by the characteristics of the charger/load circuit rather than by requirements of the cell/battery.

A third approach has been described by Robinson in PCT International Publication Number WO 93/22666. Robinson's approach is to use the noise signal itself as a source of broad-band excitation. The noise voltage across a cell and the noise current through the cell are both measured over time, and the frequency-dependent complex impedance of the cell is determined by taking the Fourier transform of their ratio. This solution to the problem is also not entirely satisfactory since it requires that broad-band noise be present to obtain accurate results. Such noise may be characteristic of batteries in service in telephone central offices but is certainly not characteristic of batteries undergoing high-rate charging from poorly-filtered power supplies. Furthermore, such measurements are impossible when the noise is insufficient or non-existent.

A fourth approach is the use of noise cancellation apparatus of the type disclosed by Champlin in U.S. Pat. No. 5,343,380. Such apparatus extends the utility of the dynamic conductance battery testing apparatus disclosed previously by Champlin in U.S. Pat. Nos. 3,873,911, 3,909,708, 4,816,768, 4,825,170, 4,881,038, 4,912,416, and 5,140,269 by permitting the measurements to be made "on line." However, this approach requires that auxiliary apparatus be used in addition to the measuring instrument itself.

SUMMARY OF THE INVENTION

A totally different approach to the problem of assessing cell/battery condition in the presence of noise is disclosed herein. According to the present invention, the cell/battery is excited by a time-varying voltage (or current) signal that is characterized by periodically making step transitions between discrete levels. The immediate change in current (or voltage) that occurs in response to such excitation has been found to be closely related to the condition of the cell/battery under test. A response signal is determined by a circuit that is only enabled during a brief "window" of time encompassing a step transition and is disabled at all other times. A unique element of this circuit is a "holding capacitor"—a device that follows the dynamic voltage of the battery during the period of disablement and stores the conditions existing at the instant of enablement throughout the ensuing enablement period. As a result of this action, the circuit responds only to changes in noise that occur during the enablement "window" but not to the actual level of the noise. By making this window of time sufficiently narrow, noise excitation signals can change by only an acceptably small amount. Residual noise can then be removed from the output by synchronously detecting the response signal and averaging the result over time. The detected and time-averaged output signal is ultimately related to the condition of the cell/battery undergoing test by an appropriate display or alarm device.

The present invention functions with the responsive circuit only enabled for step changes in one direction (i.e., for only positive-going, or only negative-going, step transitions). However, this "unilateral mode" of operation requires that changes in noise signal be smaller than the step-change of the excitation signal during the enablement window. To further enhance the noise immunity, the responsive circuit can be enabled for both step transitions from an upper level to a lower level, and for the alternate step transitions from the lower level back to the upper level. By arranging an appropriate dc bias, the response signal will then have the form of positive-going excursions above a dc bias level which alternate in time with negative-going excursions below a dc bias level. The positive response signals are detected and added to the time-average of the measurements while the detected negative response signals are subtracted. Since spurious noise signals are uncorrelated with the excitation signal, any responsive noise signals will be subtracted and added with equal frequency and will therefore tend to cancel in pairs. This "bilateral mode" of operation permits very accurate measurements to be made in the presence of noise—even when changes in noise signal during the enablement window exceed the step-changes of the excitation signal.

Noise immunity of the present invention is further enhanced by suppressing current through the cell/battery during times outside of the enablement window. Since the responsive circuitry is unresponsive to signals outside of the enablement window anyway, any current flowing through the cell/battery during this time is of little value and can be eliminated. The resulting reduction in "duty cycle" permits the current to then be increased during the enablement window without causing excessive dissipation of average power. This increased pulse current results in an increased signal-to-noise ratio compared with that possible when the cell/battery current flows continuously.

Two distinct embodiments of the present invention are disclosed. The first embodiment employs a step current-signal force and a voltage-signal response to directly determine a particular component of incremental resistance of the cell/battery undergoing test. The second embodiment employs a step voltage-signal force and a current-signal response to directly determine a particular component of incremental conductance. In my opinion, there is a distinct advantage to directly determining incremental conductance rather than resistance. I have found the appropriate conductance component to be directly proportional to active plate area and to therefore be linearly related to the available cranking current and stored energy capacity of the cell/battery. Incremental resistance, on the other hand, is inversely related to active plate area. Accordingly, its relation to available cranking current and stored energy capacity is much more obscure. While it is true that one could measure incremental resistance and then calculate its reciprocal with a microprocessor, accuracy will be diminished at the high end of the conductance scale where small errors in measured resistance will produce large errors in calculated conductance. Thus, in my opinion, the second embodiment of the disclosed invention is the preferred embodiment.

BRIEF DESCRIPTION OF THE DRAWINGS

FIG. 2a is a schematic diagram illustrating the cell/battery being excited by a current force $I_f(t)$ and yielding a voltage response $V_r(t)$. FIG. 2b is a waveform plot of the exciting current signal $I_f(t)$. FIG. 2c is a waveform plot of the responding voltage signal $V_r(t)$.

FIG. 3a is a schematic diagram illustrating the cell/battery being excited by a voltage force $V_f(t)$ and yielding a current response $I_r(t)$. FIG. 3b is a waveform plot of the exciting voltage signal FIG. 3c is a waveform plot of the responding current signal $I_r(t)$.

FIG. 4a discloses the basic circuit of an embodiment employing a step current-signal force $I_f(t)$ and a voltage-signal response $V'_r(t)$ to directly determine cell/battery resistance $R_x$. FIGS. 4b and 4c disclose two alternative forms of a current generator producing $I_f(t)$ suitable for use with the basic circuit of FIG. 4a.

FIG. 5 is a timing diagram disclosing signal relationships for a first embodiment defined by FIGS. 4a and 4b operating in the unilateral mode.

FIGS. 8a and 8b disclose basic circuits of two alternative forms of an embodiment employing a step voltage-signal force $V'_f(t)$ and a current-signal response $I'_r(t)$ to directly determine battery/cell conductance $G_x$. FIG. 8c discloses a signal voltage generator producing $V'_f(t)$ suitable for use with either of the basic circuits disclosed in FIGS. 8a and 8b.

FIG. 10 is a timing diagram disclosing signal relationships for a second embodiment defined by FIGS. 8a and 8c operating in the bilateral mode.

FIG. 11 is a timing diagram disclosing signal relationships for a second embodiment defined by FIGS. 8b and 8c operating in the bilateral mode with current suppression.

FIG. 12a depicts a half-wave detector appropriate to the unilateral mode of operation of either device. FIG. 12b depicts a full-wave detector appropriate to the bilateral mode of operation of either device.

DETAILED DESCRIPTION OF THE PREFERRED EMBODIMENTS

Figure 1:
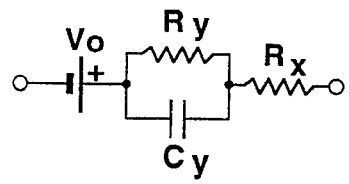
FIG. 1 depicts an equivalent electrical circuit of a cell or battery.

FIG. 1 depicts an equivalent circuit of a cell or battery that is employed herein to explain operation of the present invention. This circuit extends the ac equivalent circuit of DeBardelaben (reference cited above) and of Willihnganz and Rohner (E. Willihnganz and P. Rohner, "Battery Impedance, Farads, *Milliohms, Microhenries*", ELECTRICAL ENGINEERING, Vol. 78, No. 9, pp. 922–925, September 1959) by adding the cell/battery's open-circuit voltage $V_o$ in series with the cell/battery impedance. The resulting equivalent circuit of FIG. 1 thus applies to dc as well as to ac (i.e., time-varying) currents and voltages.

According to Willihnganz and Rohner, the elements $R_y$ and $C_y$ represent electrochemical action occurring at the plate surfaces; and element $R_x$ predominantly represents the resistance of the acid path between the plates. DeBardelaben states that he believes $R_y$ to be the dominant indicator of cell capacity. He states further that incremental measurements to determine cell capacity should therefore be made at very low frequency to avoid having capacitor $C_y$ obscure the value of $R_y$. In contrast with DeBardelaben's opinion however, my observations have shown that $R_x$ and its reciprocal $G_x$ ($G_x=1/R_x$), are, in fact, excellent indicators of cell/battery condition and capacity. Moreover, because this resistive element is not shunted by capacitance, $R_x$ or $G_x$ can be accurately determined in a "fast" measurement using techniques that are virtually immune to noise. These findings form the basis for my invention.

Figure 2A:
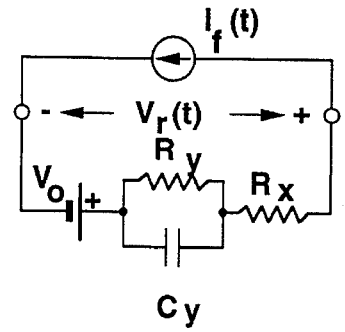
FIGS. 2a, 2b, and 2c are a group of figures depicting conditions existing when the cell/battery of FIG. 1 is excited by a current signal which periodically makes step transitions between two discrete levels.

FIG. 2a is a schematic diagram illustrating the cell/battery of FIG. 1 being excited by a current force signal $I_f(t)$ and yielding a voltage response signal $V_r(t)$. According to the polarity convention established in FIG. 2a, positive current $I_f(t)$ corresponds to discharging of the cell/battery and results in a response voltage $V_r(t)$ that is less than the open-circuit voltage $V_o$. Conversely, negative $I_f(t)$ charges the cell/battery and results in $V_r(t)$ being larger than $V_o$.

Figure 2B:
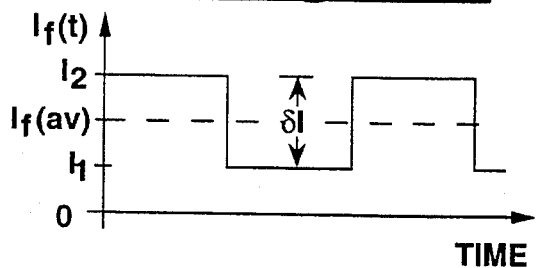

FIG. 2b depicts the current force signal $I_f(t)$ making periodic step transitions between the discrete current levels $I_1$ and $I_2$. Both current levels are positive and therefore represent discharge currents. However, the results to follow would be no different if one or both currents were in the charge direction. The $I_f(t)$ waveform has the form of a square wave with average value $I_f(av)=(I_1+I_2)/2$ and total current excursion $\delta I=(I_2-I_1)$.

Figure 2C:
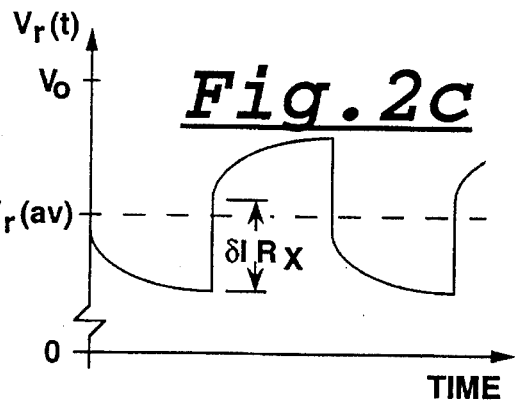

FIG. 2c shows the responding voltage signal $V_r(t)$. This waveform resembles the voltage waveform observed by DeBardelaben using a flooded lead-calcium cell rated at 1680 amp-hours. (S. DeBardelaben, "A Look at the Impedance of a Cell", INTELEC 88, pp. 394–397). This $V_r(t)$ waveform can be understood by recognizing that the voltage across capacitance $C_y$ cannot change instantaneously. Thus, when the current signal makes a step transition $\delta I$, the entire change in voltage $\delta V=-\delta I\, R_x$ initially appears across resistance $R_x$. This initial change is then followed by a more gradual exponential change as the charge stored in capacitance $C_y$ changes. The important thing to note is that the initial change in the response signal voltage $V_r(t)$ is directly proportional to the resistance $R_x$.

Figure 3A:
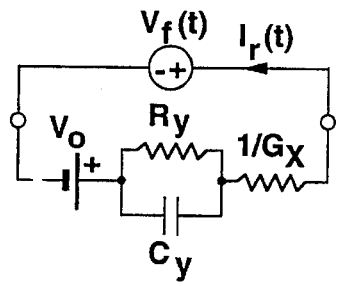
FIGS. 3a, 3b, and 3c are a group of figures depicting conditions existing when the cell/battery of FIG. 1 is excited by a voltage signal which periodically makes step transitions between two discrete levels.

FIG. 3a is a schematic diagram illustrating the cell/battery of FIG. 1 being excited by a voltage force signal $V_f(t)$ and yielding a current response signal $I_r(t)$. According to the polarity convention established in FIG. 3a, a value of $V_f(t)$ that is less than the open-circuit voltage $V_o$, and which therefore discharges the cell/battery, causes a positive response current $I_r(t)$ to flow. Conversely, a value of $V_f(t)$ that is greater than the open-circuit voltage $V_o$, and which therefore charges the cell/battery, causes a negative response current $I_r(t)$ to flow.

Figure 3B:
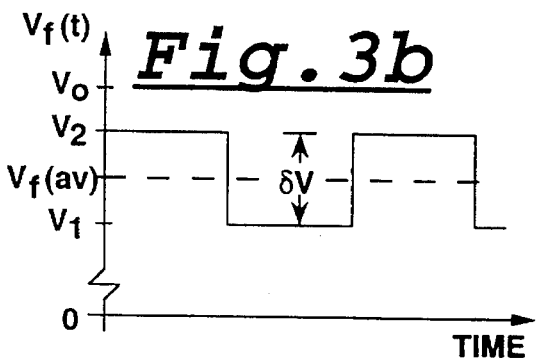

FIG. 3b depicts the voltage force signal $V_f(t)$ making periodic step transitions between the discrete voltage levels $V_1$ and $V_2$. Both voltage levels are less than $V_o$ and therefore represent voltages which discharge the cell/battery. However, the results which follow would be no different if one or both voltages were charging voltages. The $V_f(t)$ waveform has the form of a square wave with average value $V_f(av)=(V_1+V_2)/2$ and total voltage excursion $\delta V=(V_2-V_1)$.

Figure 3C:
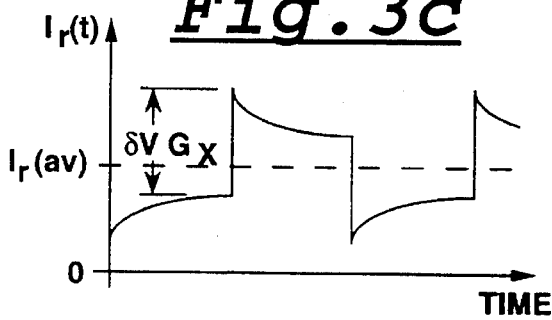

FIG. 3c shows the responding current signal $I_r(t)$. This waveform can be understood by again recognizing that the voltage across capacitance $C_y$ cannot change instantaneously. Thus, when the voltage signal makes a step transition $\delta V$, the entire change in voltage initially appears across resistance $R_x$ and therefore produces an initial change in current $\delta I=-\delta V/R_x=-\delta V G_x$. This initial current change is then followed by a more gradual exponential change as the charge on capacitance $C_y$ changes. The important thing to note here is that the initial change in the response signal current $I_r(t)$ is directly proportional to the conductance $G_x$.

Figure 4A:
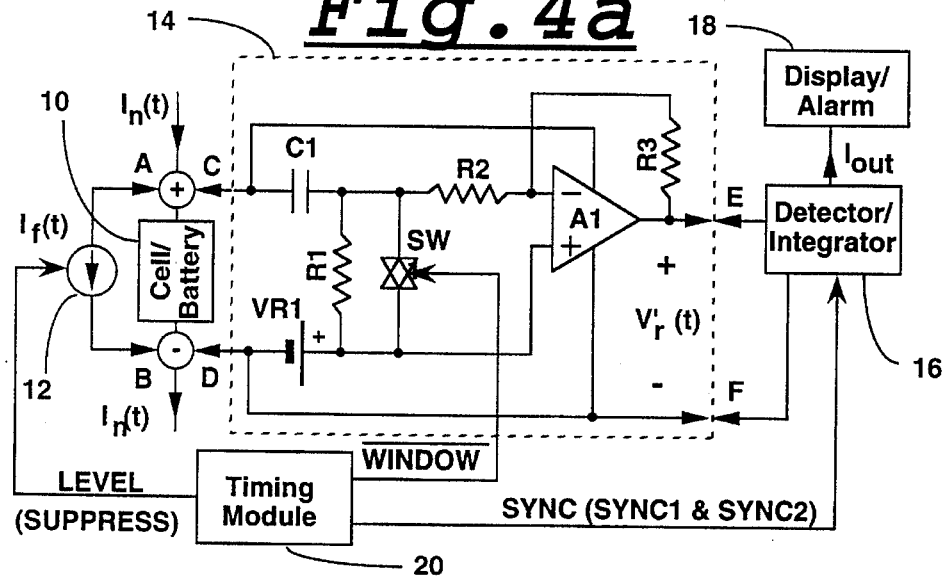
FIGS. 4a, 4b, and 4c are a group of three figures which describe a first embodiment of the present invention.
Figure 4B:
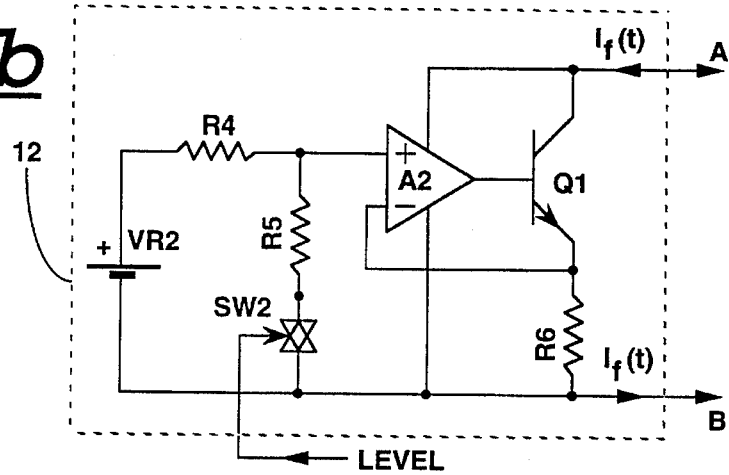
Figure 4C:
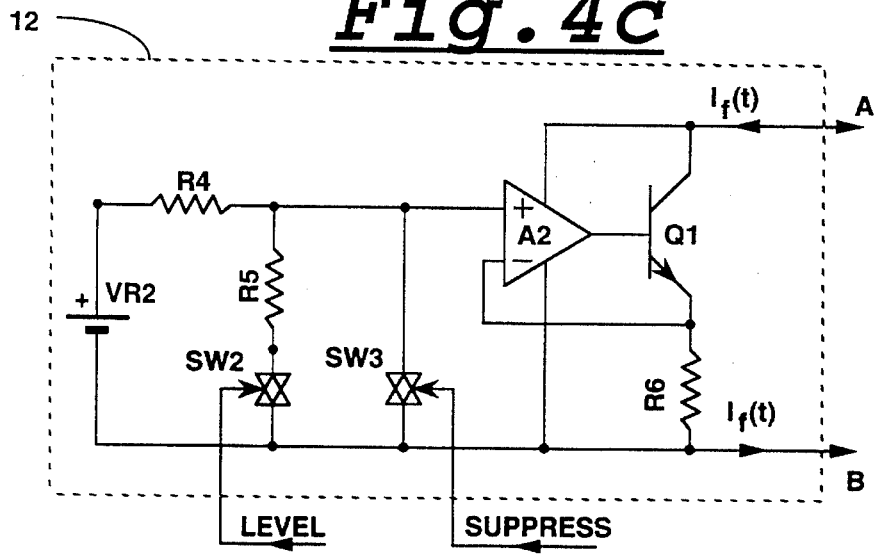

FIGS. 4a, 4b, and 4c are a group of three figures which describe a first embodiment of the present invention. FIG. 4a discloses the basic circuit of an embodiment employing a step current-signal force $I_f(t)$ and a voltage-signal response $V'_r(t)$ to directly determine cell/battery resistance $R_x$. FIGS. 4b and 4c disclose two alternative forms of a step current-force producing circuit suitable for use with the basic circuit of FIG. 4a.

Referring to FIG. 4a, a cell/battery 10 undergoing test couples to a current-force producing circuit 12 at current-carrying contacts A and B, and couples to a voltage-response determining circuit 14 at voltage-sensing contacts C and D. Cell/battery 10 may also be conducting a noise signal current $I_n(t)$ generated externally as shown. The output signal $V'_r(t)$ of voltage-response determining circuit 14 is coupled to Detector/Integrator 16 at terminals E and F. The output current $I_{out}$ of Detector/Integrator 16 is coupled to Display/Alarm device 18. Timing Module 20 generates a logic signal LEVEL (and an optional logic signal SUPPRESS) which are coupled to current-force producing circuit 12; a logic signal $\overline{\text{WINDOW}}$ which is coupled to voltage-response determining circuit 14; and a logic signal SYNC (or optionally logic signals SYNC1 and SYNC2) coupled to Detector/Integrator 16. Although example circuits for Detector/Integrator 16, Display/Alarm 18, and Timing Module 20, are disclosed below, the functions of all three of these elements can be readily performed by a single microprocessor using techniques that are well-known to one of ordinary skill in the art.

Voltage-response determining circuit 14 comprises operational amplifier A1, which is configured as an inverting amplifier by virtue of feedback resistors R2 and R3; reference voltage VR1, which sets the output voltage level of operational amplifier A1; RC network R1–C1 which couples the voltage-sensing contacts C and D to the input of the inverting amplifier; and logic-controlled switch SW1 which bridges across resistor R1 in parallel with the inverting amplifier input. Operational amplifier A1 obtains power from cell/battery 10 through contacts C and D and can be an integrated circuit type LT1013 manufactured by Linear Technology Corporation. Reference voltage VR1 can be an integrated circuit type LM336-2.5 manufactured by National Semiconductor Corporation. Logic-controlled switch SW1 can be one element of an integrated circuit type CD4066 manufactured by National Semiconductor Corporation and which also obtains power from cell/battery 10 through contacts C and D.

Capacitor C1, besides providing ac coupling and dc blocking at the input of the amplifier, serves a very important additional function. As will be disclosed in detail below, C1 acts as a "holding" capacitor for storing the initial dynamic voltage of cell/battery 10 throughout the "window" period of amplifier enablement.

The circuit disclosed in FIG. 4a operates as follows. Throughout most of time, logic signal $\overline{\text{WINDOW}}$ is held at a logic "1" by Timing Module 20 causing switch SW1 to be "closed." This short-circuits the inverting amplifier's input thus disabling the inverting amplifier. During this time period, the inverting amplifier's output voltage V'$_r$(t), as measured between contacts E and F, simply equals the reference voltage VR1. With resistor R1 shorted out, the series combination of capacitor C1 and reference voltage VR1 is coupled directly across cell/battery 10. Accordingly, the voltage across capacitor C1 instantaneously follows any dynamic variations in cell/battery voltage which would result from noise currents I$_n$(t) passing through cell/battery 10 during this disablement period.

An enablement "window" period is initiated by Timing Module 20 bringing logic signal $\overline{\text{WINDOW}}$ to a logic "0." This action causes switch SW1 to open thereby enabling the inverting amplifier. Furthermore, since the voltage across capacitor C1 cannot change instantaneously, the dynamic voltage of cell/battery 10 at the instant before the amplifier becomes enabled will be stored upon capacitor C1 and will thereupon subtract from the total voltage applied to the amplifier input immediately after enablement. The enabled amplifier will thus be only sensitive to changes in the dynamic voltage across cell/battery 10 which occur after the amplifier is enabled, but will totally disregard the actual level of any noise signals that may be present at the instant of enablement. Because of this unique storage action by capacitor C1, I refer this important element as a "holding" capacitor.

Immediately after $\overline{\text{WINDOW}}$ assumes a logic "0", Timing Module 20 changes the logic state of LEVEL thereby causing current-force producing circuit 12 to effect a step transition, δI, in I$_f$(t). As discussed above with reference to FIG. 2C, the dynamic response of cell/battery 10 to such a force is an immediate voltage change δV=−δI R$_x$. With the circuit of FIG. 4a, this voltage change will then be amplified by the gain of the inverting amplifier, −(R3/R2). Accordingly, the amplifier's output voltage, as observed between terminals E and F, will be V'$_r$(t)=VR1±δI (R3/R2) R$_x$; where the positive sign corresponds to positive-going I$_f$(t) transitions (increasing discharge), and vice-versa. One sees that the output voltage of the amplifier in the circuit of FIG. 4a contains a voltage component that is directly proportional to the desired cell/battery resistance R$_x$.

In order to obtain high noise immunity, the enablement window should be sufficiently narrow that noise signals can change by only an acceptably small amount during amplifier enablement. Furthermore, the R1C1 product must be large compared with the window width in order to ensure that the "holding" capacitor maintains its charge throughout the entire enablement window. The minimum practical window width will be dictated by parasitic elements which affect the transient rise and fall times. I have found that a window width of T$_w$=200 μS along with R1C1=20 mS gives good results.

FIG. 4b discloses one embodiment of a step current-force producing circuit 12 of FIG. 4a. Operational amplifier A2 receives power from cell/battery 10 through current-carrying contacts A and B and drives the base of npn power transistor Q1 configured as an emitter follower. The series combination of power transistor Q1 and power resistor R6 couples across cell/battery 10 via current-carrying contacts A and B. The common connection of power resistor R6 and the emitter of Q1 couples to the inverting (−) input of operational amplifier A1. Because of the negative feedback provided by this coupling, the voltage across power resistor R6 will equal the voltage between the noninverting (+) input of operational amplifier A2 and "ground" (terminal B).

The voltage at the noninverting input of A2 is determined by reference voltage VR2, voltage divider resistors R4 and R5, and the state of logic-controlled switch SW2. With logic signal LEVEL at a logic "0", SW2 is open-circuit, and there is no voltage drop in R4. Under these conditions, the complete reference voltage VR2 appears across R6 and the discharge current is at the high level I$_2$=VR2/R6. When logic signal LEVEL assumes a logic "1", switch SW2 closes and voltage divider resistors R4 and R5 reduce the voltage applied to the noninverting input of A2. Under these conditions, the discharge current is at the low level I$_1$=(VR2)(R5)/(R4+R5)R6.

By way of example, operational amplifier A2 can be an integrated circuit type LT1013 manufactured by Linear Technology Corporation; reference voltage VR2 can be an integrated circuit type LM336-2.5 manufactured by National Semiconductor Corporation; Logic-controlled switch SW2 can be one element of an integrated circuit type CD4066 manufactured by National Semiconductor Corporation; power transistor Q1 can be a type TIP31 manufactured by Harris Semiconductor Corporation; power resistor R6 can be 2.5 ohms; and voltage divider resistors R4 and R5 can each be 1K ohms. With these choices, the high level current is I$_2$=1 amp, and the low level current is I$_1$=0.5 amp.

The step current-force producing circuit 12 of FIG. 4c is identical to the circuit disclosed in FIG. 4b except that it includes an additional logic-controlled switch SW3. This switch shorts the noninverting input of operational amplifier A2 to "ground" when logic signal SUPPRESS is at a logic "1." Accordingly, I$_f$(t)=0 whenever SUPPRESS="1", regardless of the logic state of logic signal LEVEL.

Three distinct operating modes of the first embodiment of the invention have been identified and will be explained with reference to the timing diagrams disclosed in FIGS. 5, 6, and 7.

FIG. 5 is a timing diagram disclosing signal relationships for a first embodiment defined by FIGS. 4a and 4b operating in the unilateral mode. In this mode of operation VR1 is chosen to be zero, thus causing the amplifier output voltage V'$_r$(t) to be zero when the enablement window is "closed." In addition, R5 is chosen to be zero so that I$_f$(t) makes transitions between zero and VR2/R6 amps.

Referring to FIG. 5, logic signal LEVEL periodically assumes a logic "0" causing I$_f$(t) to periodically step up to VR2/R6 with period T$_p$. This period can, for example be 100 mS, corresponding to a repetition rate of 10 Hz. However, just before LEVEL makes its transition from "1" to "0", logic signal $\overline{\text{WINDOW}}$ makes a transition from "1" to "0." It then makes a transition back to "1" again before LEVEL returns to "1." As a result, the enablement window width T$_w$ encompasses the low-to-high transition of I$_f$(t) but not the high-to-low transition. Accordingly, the amplifier output voltage V'$_r$(t) has the form of positive pulses only—each beginning when LEVEL makes a "1" to "0" transition, ending when $\overline{\text{WINDOW}}$ makes a "0" to "1" transition, and having amplitude (VR2/R6) (R3/R2) R$_x$. An output signal I$_{out}$ proportional to R$_x$, is derived from V'$_r$(t) by "half-wave" rectifying the signal to recover its dc content ("detecting") and then integrating, or averaging, the result over time to remove the effects of residual noise. Synchronous circuitry which accomplishes these last steps is described below with reference to FIG. 12a.

Figure 6:
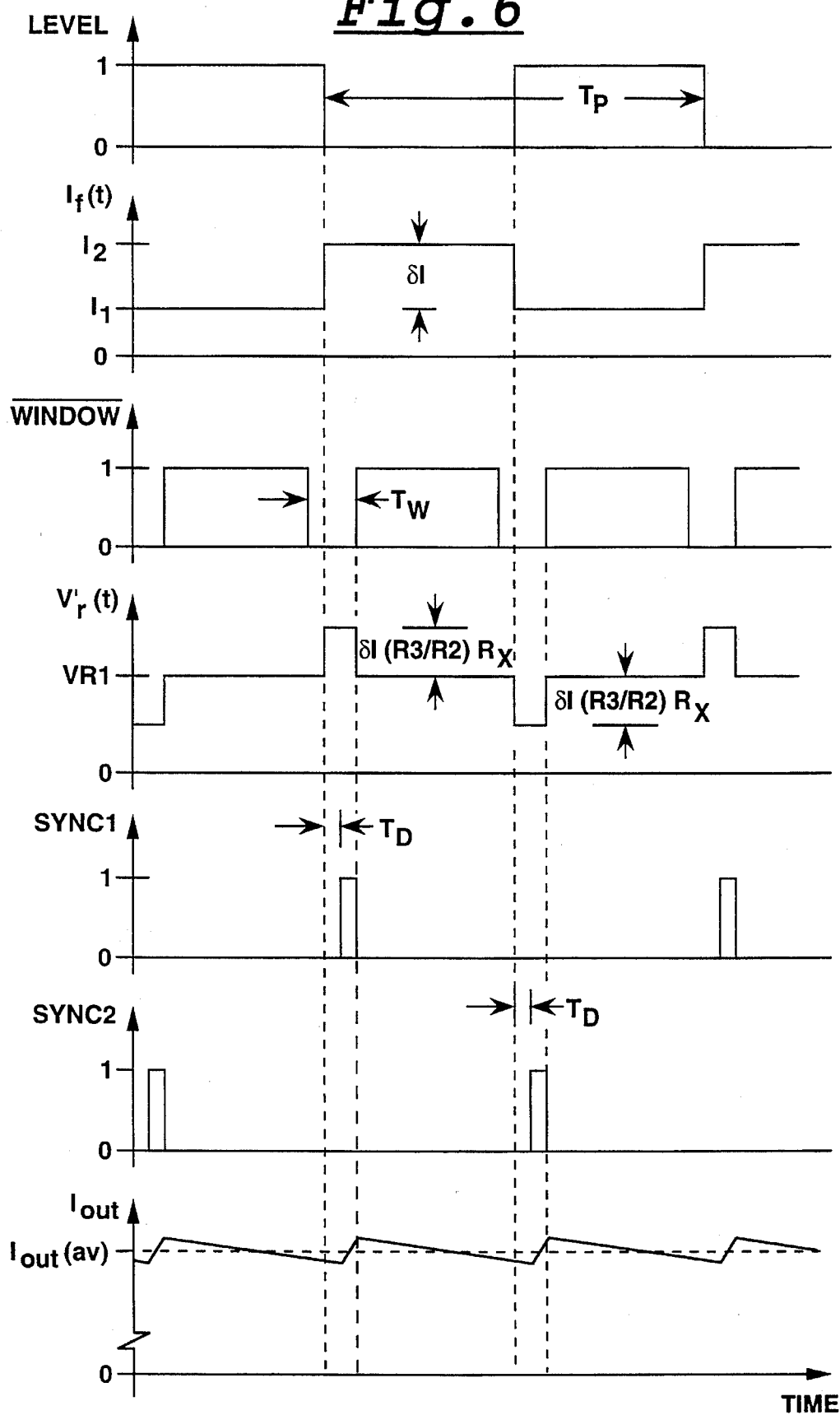
FIG. 6 is a timing diagram disclosing signal relationships for a first embodiment defined by FIGS. 4a and 4b operating in the bilateral mode.

FIG. 6 is a timing diagram disclosing signal relationships for a first embodiment defined by FIGS. 4a and 4b operating in the bilateral mode. Because of the inherent symmetry of this mode of operation, enhanced noise immunity is possible in comparison with the unilateral mode. With the bilateral mode of operation, VR1 is chosen to be a positive quantity (e.g., 2.5 volts) thus causing the amplifier output voltage $V'_r(t)$ to be biased positively when the enablement window is "closed." In addition, logic signal LEVEL is chosen to be a symmetrical signal; spending equal times in the "0" and "1" states.

Referring to FIG. 6, logic signal LEVEL switches states periodically causing $I_f(t)$ to periodically step between discrete current levels $I_1$ and $I_2$ with period $T_p$. This period is symmetrical and can, for example be 100 mS, corresponding to a repetition rate of 10 Hz. Just before LEVEL makes its transition from "1" to "0", logic signal $\overline{\text{WINDOW}}$ makes a transition from "1" to "0." It remains in the "0" state for a short time $T_w$ (less than $T_p$) and then makes a transition back to "1." Later, just before LEVEL makes its transition from "0" to "1", logic signal $\overline{\text{WINDOW}}$ again assumes a "0" state. It again remains in the "0" state for time $T_w$ and then makes a transition back to "1." As a result, enablement windows of width $T_w$ now encompass alternating low-to-high transitions and high-to-low transitions of $I_f(t)$. The amplifier output voltage $V'_r(t)$ has the form of a VR1 bias level with alternating positive and negative pulses extending above and below it. The pulses each begin when LEVEL changes state and end when $\overline{\text{WINDOW}}$ makes a "0" to "1" transition. The pulse amplitude is $\pm(I_2-I_1)$ (R3/R2) $R_x$.

An output signal $I_{out}$, that is proportional to $R_x$, is derived from $V'_r(t)$ by "full-wave" rectifying this signal and then integrating, or averaging, the result over time to remove the effects of residual noise. Synchronous circuitry which accomplishes these last steps is described below with reference to FIG. 12b. In this detection and averaging process, enhanced noise immunity results from the fact that output pulses are alternately added and subtracted. Since noise signals are uncorrelated with signal pulses, noise will be added and subtracted with equal frequency and will tend to cancel out in pairs.

Figure 7:
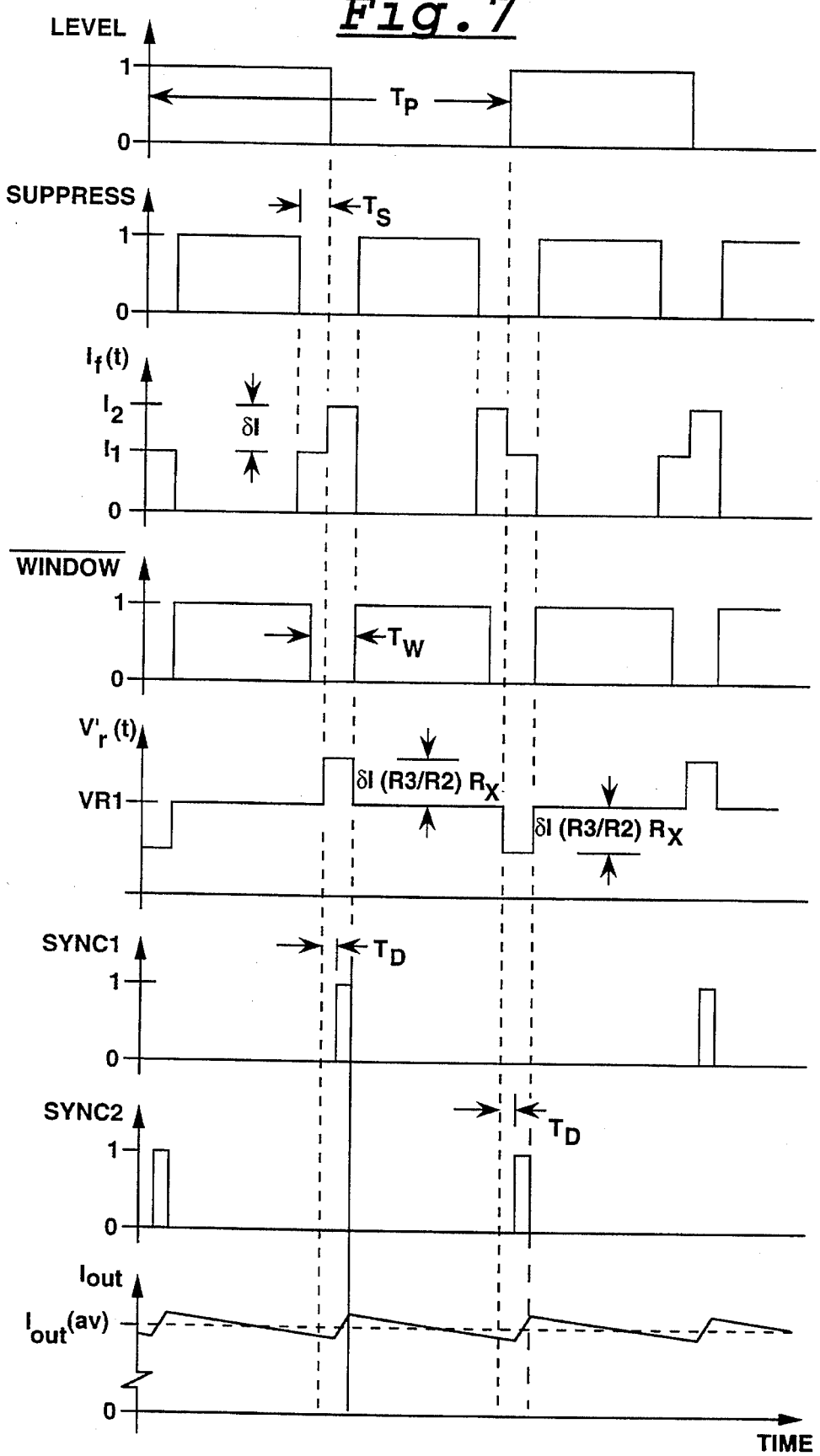
FIG. 7 is a timing diagram disclosing signal relationships for a first embodiment defined by FIGS. 4a and 4c operating in the bilateral mode with current suppression.

FIG. 7 is a timing diagram disclosing signal relationships for a first embodiment defined by FIGS. 4a and 4c operating in the bilateral mode with current suppression. Noise immunity can be further enhanced in the bilateral mode by suppressing current through the cell/battery during times outside of the enablement window. The resulting reduction in "duty cycle" permits the current to then be increased during the enablement window without causing excessive dissipation of average power. This increased pulse current results in an increased signal-to-noise ratio compared with that possible when the cell/battery current flows continuously.

Referring to FIG. 7, the timing of the LEVEL and $\overline{\text{WINDOW}}$ signals is identical to that disclosed in FIG. 6. In addition, throughout most time, logic signal SUPPRESS is in a "1" state causing $I_f(t)$ to be zero. However, at a time $T_s$ before LEVEL changes state, SUPPRESS goes to "0." This enables $I_f(t)$ which then assumes either current $I_1$ or current $I_2$, depending upon the logic state of LEVEL. Time $T_s$ is the "setup" time and is the time required for the circuit to reach equilibrium after having the current switched on. I have found $T_s$=200 μS to give satisfactory results. The SUPPRESS signal returns to the "1" state coincidentally with $\overline{\text{WINDOW}}$ returning to the "1" state. Except for the waveform of the current force $I_f(t)$, all of the waveforms are identical to those of FIG. 6. In particular, the amplifier output voltage $V_r(t)$ has the form of a VR1 bias level with alternating positive and negative pulses extending above and below it. The pulses each begin when LEVEL changes state and end when $\overline{\text{WINDOW}}$ makes a "0" to "1" transition. The pulse amplitude is $\pm(I_2-I_1)$ (R3/R2) $R_x$.

Figure 8A:
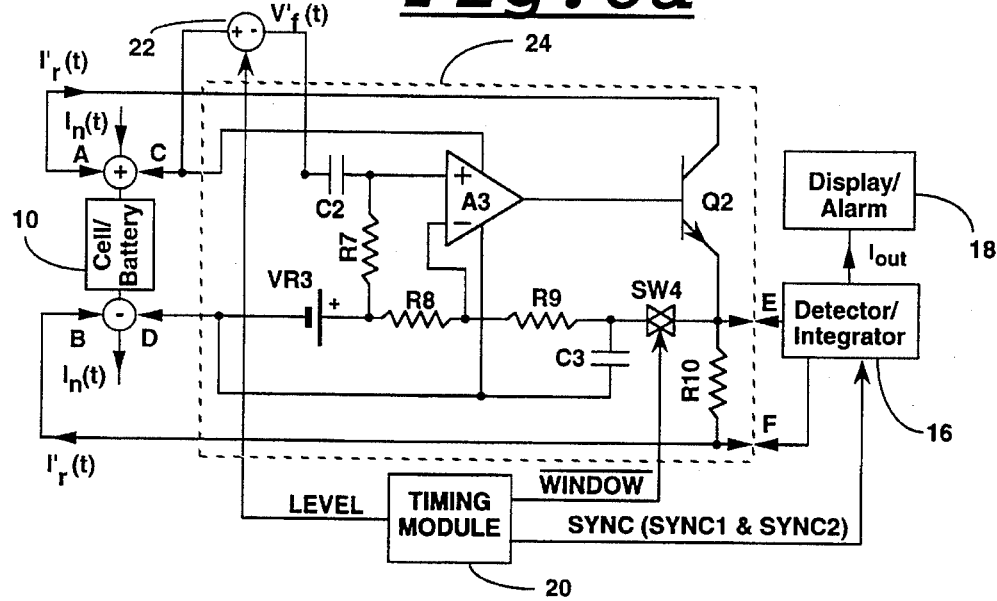
FIGS. 8a, 8b, and 8c are a group of three figures which describe a second embodiment of the present invention.
Figure 8B:
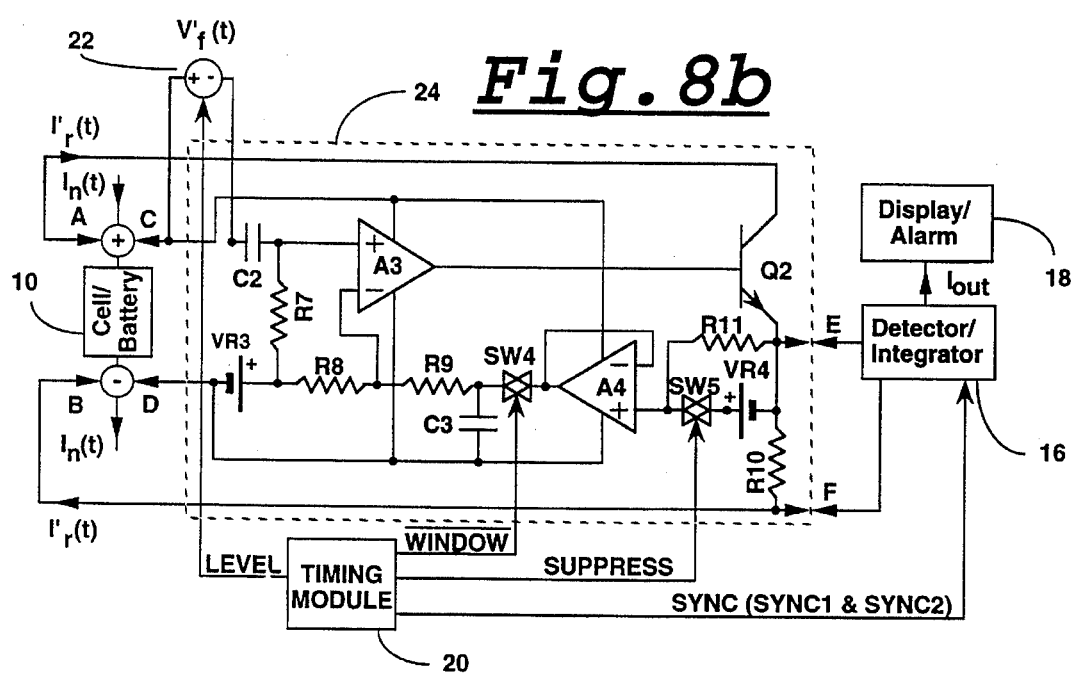
Figure 8C:
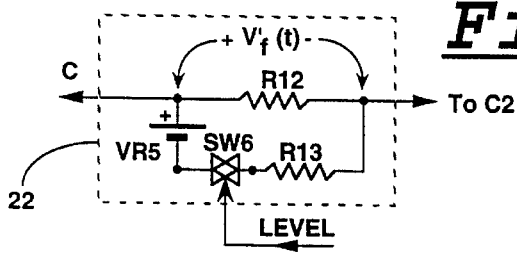

Turning now to FIGS. 8a, 8b, and 8c, this group of three figures discloses a second embodiment of the present invention. FIGS. 8a and 8b disclose basic circuits of two alternative forms of an embodiment employing a step voltage-signal force $V'_r(t)$ and a current-signal response $I'_r(t)$ to directly determine battery/cell conductance $G_x$. FIG. 8c discloses a step signal-voltage generator producing $V'_r(t)$ suitable for use with either the basic circuit disclosed in FIG. 8a, or that disclosed in FIG. 8b.

There is a distinct advantage to directly determining $G_x$ rather than $R_x$ as is done by the first embodiment. I have found that $G_x$ is directly proportional to active plate area and is therefore linearly related to available cranking current and stored energy capacity of cell/battery 10. Since $R_x$ is inversely related to plate area, the relationship between $R_x$ and cranking current or stored energy capacity is much more obscure. However, because of the extremely small impedance of a cell/battery (generally a few milliohms or less) one faces a fundamental experimental problem in attempting to apply a voltage-signal force and observe a current-signal response. Accordingly, the second embodiment of the invention disclosed herein employs feedback techniques, including dual-feedback, to achieve the desired result.

Referring first to FIG. 8a, cell/battery 10 undergoing test couples to a step voltage-force producing circuit 22 at contact C, and couples to a current-response determining circuit 24 at contacts A, B, and D. Cell/battery 10 may also be conducting a noise signal current $I_n(t)$ generated externally as shown. The output voltage $I'_r(t)$ R10 of current-response determining circuit 24 is coupled to Detector/Integrator 16 at terminals E and F. The output current $I_{out}$ of Detector/Integrator 16 is coupled to Display/Alarm device 18. Timing Module 20 generates a logic signal LEVEL which is coupled to voltage-force producing circuit 22; a logic signal $\overline{\text{WINDOW}}$ which is coupled to current-response determining circuit 24; and a logic signal SYNC (or optionally logic signals SYNC1 and SYNC2) coupled to Detector/Integrator 16. Detector/Integrator 16, Display/Alarm 18, and Timing Module 20 are all identical to corresponding elements of the first embodiment described with reference to FIG. 4a. Although example circuits for these elements are disclosed herein, the functions of all three can be readily performed by a single microprocessor using techniques that are well-known to one of ordinary skill in the art.

Current-response determining circuit 24 comprises operational amplifier A3 which receives operating power from cell/battery 10 via contacts C and D; reference voltage VR3 which establishes the bias of A3; npn power transistor Q2 configured as an emitter follower output stage; logic-controlled switch SW4; signal resistors R7, R8, R9; power resistor R10; coupling capacitor C2; and "holding" capacitor C3. Operational amplifier A3 can be an integrated circuit type LT1028 manufactured by Linear Technology Corporation. Reference voltage VR3 can be an integrated circuit type LM336-2.5 manufactured by National Semiconductor Corporation. Power transistor Q2 can be a type BD787 manufactured by Motorola, Inc. Logic-controlled switch SW4 can be one element of an integrated circuit type CD4066 manufactured by National Semiconductor Corporation.

The circuit of FIG. 8a functions as follow. Throughout most of time, logic signal $\overline{\text{WINDOW}}$ is held at a logic "1" by timing module 20, thus causing switch SW4 to be "closed." Accordingly, a dc feedback path exists from amplifier output terminal E to the inverting (−) input of A3 via resistor R9. As a result of this negative feedback, the dc voltage across R10 will equal VR3, the dc voltage applied between the noninverting input and the negative terminal of the cell/battery. Thus, the dc amplifier output voltage across terminals E and F is the reference voltage VR3, and the dc current through contacts A and B of cell/battery 10 is VR3/R10.

In addition to the dc feedback, there are two ac feedback circuits of importance; an internal feedback circuit and an external feedback circuit. Both circuits involve coupling capacitor C2 whose value is chosen to be large enough that its impedance is small compared with R7 at all frequencies of interest. Thus, as far as time-varying signals are concerned, the noninverting (+) input of A3 can be assumed to be connected directly to terminal C via voltage-force producing circuit 22; and resistor R7 can be ignored. Accordingly, the positive terminal of cell/battery 10 can be considered as "ac ground."

The internal ac feedback path is from amplifier output terminal E through (closed) SW4 and resistor R9 to the inverting (−) input of A3; thence through resistor R8, through reference voltage VR3 to contact D, and then through cell/battery 10 to "ac ground." Resistors R8 and R9 are each chosen to be 100K. Since these values are very large compared with the impedance of either cell/battery 10 or reference voltage VR3, the transfer function or "feedback ratio" of this internal ac feedback circuit is essentially R8/(R8+R9)=½.

The external ac feedback path is from amplifier output terminal E through power resistor R10 to the negative terminal of cell/battery 10 via contact B and then through the cell/battery 10 to "ac ground." The negative terminal of cell/battery 10 couples to the inverting (−) input of A3 via VR3 and R8. Power resistor R10 is chosen to be of the order of 1 ohm and the cell/battery impedance Z(bat) is known to be of the order of 1 milliohm. Thus the transfer function or "feedback ratio" of this external ac feedback circuit is essentially $Z(bat)/\{R10+Z(bat)\} \approx 10^{-3}$—three orders of magnitude smaller than the feedback ratio of the internal feedback circuit.

With $\overline{WINDOW}$ in a logic "1" state, the internal ac feedback ratio is approximately 1000 times larger than the external ac feedback ratio. Accordingly, the ac gain of the amplifier is almost exclusively determined by the internal feedback circuit and is therefore given by −R9/R8=−1. Because of this extremely small value, the ac amplifier is effectively disabled while in this state. Capacitor C3, which bridges directly across the amplifier output with SW4 closed, is driven by the low impedance emitter follower stage and therefore instantaneously follows any dynamic variations in cell/battery voltage which would result from noise currents $I_n(t)$ passing through cell/battery 10.

A "window" period is initiated by Timing Module 20 bringing logic signal $\overline{WINDOW}$ to a logic "0." This action causes switch SW4 to open thereby removing the internal feedback path. The ac amplifier gain, which is now determined by the external feedback circuit, will increase by a factor of approximately 1000. The ac amplifier is therefore effectively enabled. Furthermore, since the voltage across capacitor C3 cannot change instantaneously, the dynamic voltage at the noninverting input of A3 at the instant before the amplifier becomes enabled will be stored upon capacitor C3 and will be maintained immediately after enablement. The enabled feedback amplifier will thus be only sensitive to changes in the dynamic voltage across cell/battery 10 which occur after the amplifier is enabled, but will totally disregard the actual level of any noise signals that may be present at the instant of enablement. Capacitor C3 of the second embodiment therefore serves the same important function as capacitor C1 of the first embodiment. Accordingly, I likewise refer to capacitor C3 as a "holding" capacitor.

Immediately after $\overline{WINDOW}$ assumes a logic "0", Timing Module 20 changes the logic state of LEVEL thereby causing voltage-force producing circuit 22 to effect a step transition, $\delta V$, in $V'_f(t)$. Because of the high gain of operational amplifier A3 along with the negative feedback provided by the external path, the input terminals of operational amplifier A3 represent a "virtual" short circuit whose voltage can therefore not change. Accordingly, current-response determining circuit 24 immediately responds by passing an appropriate time-varying current $I'_r(t)$ through contacts B and A to cause an equal and opposite step transition −$\delta V$ to appear between voltage sensing contacts C and D of cell/battery 10. As discussed above with reference to FIG. 3C, the dynamic current response of cell/battery 10 to a step voltage change across its terminals is an immediate current change $\delta I = -\delta V\, G_x$. The complete response current of circuit 24 of FIG. 8a, including both dc and time-varying components, is therefore $I'_r(t) = VR3/R10 \pm \delta V\, G_x$; where the positive sign corresponds to negative-going $V'_f(t)$ transitions (increasing discharge), and vice-versa. One sees that the output of current-response determining circuit 24 in FIG. 8a contains a component that is directly proportional to the desired cell/battery conductance $G_x$. This current component passes through resistor R10 thus producing a voltage signal component $\pm \delta V\, G_x R10$ between output terminals E and F that is likewise directly proportional to $G_x$.

For high noise immunity, the enablement window should be sufficiently narrow that noise signals can only change by an acceptably small amount during amplifier enablement. Furthermore, the (R8+R9) C3 product must be large compared with the window width in order to ensure that the "holding" capacitor maintains its charge throughout the entire enablement window. The minimum practical window width will be dictated by parasitic elements which affect the transient rise and fall times. I have found that a window width of $T_w$=200 µS along with (R8+R9) C3=20 mS gives good results.

FIG. 8b discloses an alternative second embodiment circuit employing a step voltage-signal force $V'_f(t)$ and current-signal response $I'_r(t)$ to directly determine $G_x$. This circuit is similar to the circuit disclosed in FIG. 8a but includes several additional components which permit the implementation of current suppression. The additional components are operational amplifier A4 configured as a unity gain voltage follower; reference voltage VR5; logic-controlled switch SW5; and coupling resistor R11. These components will have no effect during the enablement window period since switch SW4 will then be open. With SW4 closed however, the dc voltage across resistor R10, and hence the dc current passed through the battery, will be determined by the state of logic signal SUPPRESS. With SUPPRESS in a "0" state, SW5 is an open-circuit and the output voltage of voltage follower A4 is the voltage at terminal E. Under these conditions, the dc output current is the same as for the circuit of FIG. 8a, namely VR3/R10. With SUPPRESS at logic "1" however, a dc "bucking voltage" VR4 is inserted into the internal feedback path. This voltage subtracts from the voltage at output terminal E. As a result, the dc output current with $\overline{WINDOW}$ and SUPPRESS both in logic "1" states is (VR3−VR4)/R10. By choosing VR4=VR3, this dc current can be reduced to zero.

FIG. 8c discloses a simple step voltage-force producing circuit 22 suitable for use with either of the basic circuits disclosed in FIGS. 8a and 8b. This circuit comprises reference voltage VR5, logic-controlled switch SW6, and resistors R12 and R13. With logic signal LEVEL in a "0" state, SW6 will be open and there will be no voltage drop across R12. Under this condition, $V'_r(t)=0$. However, with logic signal LEVEL in a "1" state, SW6 is closed so that $V'_r(t)=$ (VR5) (R12)/(R12+R13)=$\delta V$.

Figure 9:
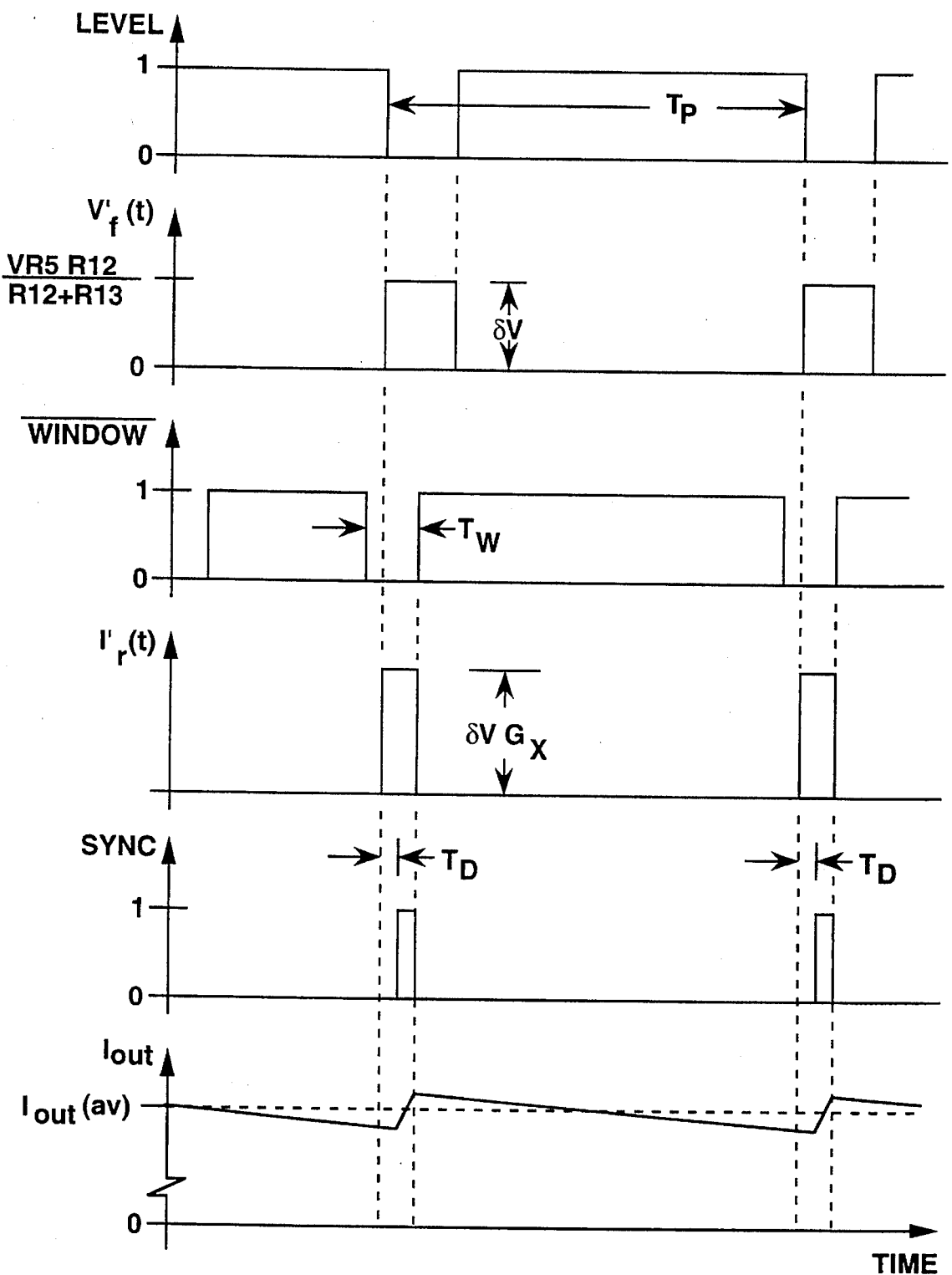
FIG. 9 is a timing diagram disclosing signal relationships for a second embodiment defined by FIGS. 8a and 8c operating in the unilateral mode.

Three distinct operating modes of the second embodiment of the invention have been identified and will be explained with reference to the timing diagrams disclosed in FIGS. 9, 10, and 11. FIG. 9 is a timing diagram disclosing signal relationships for a second embodiment defined by FIGS. 8a and 8c operating in the unilateral mode. In this mode of operation VR3 is chosen to be zero, thus causing the dc current VR3/R10 to be zero when the enablement window is "closed."

Referring to FIG. 9, logic signal LEVEL periodically assumes a logic "0" causing $V'_r(t)$ to periodically step from zero to $\delta V$ with period $T_p$. This period can, for example be 100 mS, corresponding to a repetition rate of 10 Hz. However, just before LEVEL makes its transition from "1" to "0" logic signal $\overline{\text{WINDOW}}$ makes a transition from "1" to "0." It then makes a transition back to "1" again before LEVEL returns to "1." As a result, the enablement window width $T_w$ encompasses the low-to-high transition of $V'_r(t)$ but not the high-to-low transition. Accordingly, the response current $I'_r(t)$ has the form of positive pulses only—each beginning when LEVEL makes a "1" to "0" transition, ending when $\overline{\text{WINDOW}}$ makes a "0" to "1" transition, and having amplitude $\delta V$ $G_x$. An output signal $I_{out}$, that is proportional to $G_x$, is derived from $I'_r(t)$ by "half-wave" rectifying the signal across resistor R10 to recover its dc content ("detecting") and then integrating, or averaging, the result over time to remove the effects of residual noise. Synchronous circuitry which accomplishes these last steps is described below with reference to FIG. 12a.

FIG. 10 is a timing diagram disclosing signal relationships for a second embodiment defined by FIGS. 8a and 8c operating in the bilateral mode. Because of the inherent symmetry of this mode of operation, enhanced noise immunity is possible in comparison with the unilateral mode. With the bilateral mode of operation, VR3 is chosen to be a positive quantity (e.g., 2.5 volts) thus causing the response current $I'_r(t)$ to have a positive dc component when the enablement window is "closed." In addition, logic signal LEVEL is chosen to be a symmetrical signal; spending equal times in the "0" and "1" states.

Referring to FIG. 10, logic signal LEVEL switches states periodically causing $V'_r(t)$ to periodically step between discrete voltage levels 0 and $\delta V$ with period $T_p$. This period is symmetrical and can, for example be 100 mS, corresponding to a repetition rate of 10 Hz. Just before LEVEL makes its transition from "1" to "0", logic signal $\overline{\text{WINDOW}}$ makes a transition from "1" to "0." It remains in the "0" state for a short time $T_w$ (less than $T_p$) and then makes a transition back to "1." Later, just before LEVEL makes its transition from "0" to "1", logic signal $\overline{\text{WINDOW}}$ again assumes a "0" state. It again remains in the "0" state for time $T_w$ and then makes a transition back to "1." As a result, enablement windows of width $T_w$ now encompass alternating low-to-high transitions and high-to-low transitions of $V'_r(t)$. The response current $I'_r(t)$ has the form of a VR3/R10 bias level with alternating positive and negative pulses extending above and below it. The pulses each begin when LEVEL changes state and end when $\overline{\text{WINDOW}}$ makes a "0" to "1" transition. The pulse amplitude is $\pm \delta V$ $G_x$.

An output signal $I_{out}$, that is proportional to $G_x$, is derived from $I'_r(t)$ by "full-wave" rectifying the $I'_r(t)$ R10 signal and then integrating, or averaging, the result over time to remove the effects of residual noise. Synchronous circuitry which accomplishes these last steps is described below with reference to FIG. 12b. In this detection and averaging process, enhanced noise immunity results from the fact that output pulses are alternately added and subtracted. Since noise signals are uncorrelated with these pulses, noise will be added and subtracted with equal frequency and will tend to cancel out in pairs.

FIG. 11 is a timing diagram disclosing signal relationships for a second embodiment defined by FIGS. 8b and 8c operating in the bilateral mode with current suppression. Noise immunity can be further enhanced by choosing VR4= VR3 in FIG. 8b thus suppressing current through the cell/ battery during times outside of the enablement window. The resulting reduction in "duty cycle" permits the current to then be increased during the enablement window without causing excessive dissipation of average power. This increased pulse current results in an increased signal-to-noise ratio compared with that possible when the cell/battery current flows continuously.

Referring to FIG. 11, the timing of the LEVEL and $\overline{\text{WINDOW}}$ signals is identical to that disclosed in FIG. 10. In addition, throughout most of the disablement period, logic signal SUPPRESS is in a "1" state causing $I'_r(t)$ to be zero. However, at a time $T_s$ before LEVEL changes state, SUPPRESS goes to "0." The response current $I'_r(t)$ then assumes its normal dc bias level VR3/R10. Time $T_s$ is the "setup" time and is the time required for the circuit to reach equilibrium after having the current switched on. I have found that $T_s$=200 μS gives good results. The SUPPRESS signal returns to the "1" state coincidentally with $\overline{\text{WINDOW}}$ returning to the "1" state. Within each enablement window, the current response $I'_r(t)$, is seen to be identical to that of FIG. 10 and consists of alternating pulses with amplitude $\pm \delta V$ $G_x$ above and below a bias level of VR3/R10.

Figure 12A:
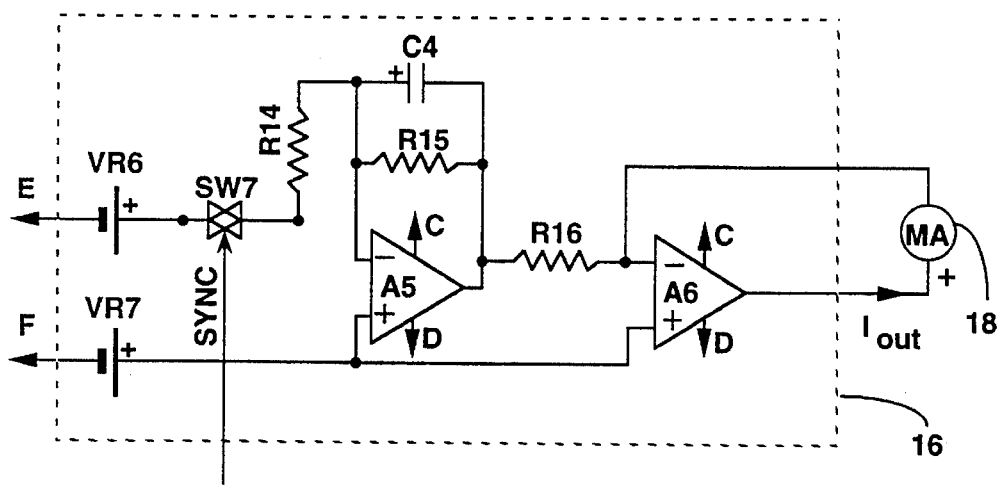
FIGS. 12a and 12b are diagrams of a synchronous detector/integrator 16 and display device 18 suitable for use with either the first invention embodiment disclosed in FIGS. 4a, 4b, and 4c, or the second invention embodiment disclosed in FIGS. 8a, 8b, and 8c.
Figure 12B:
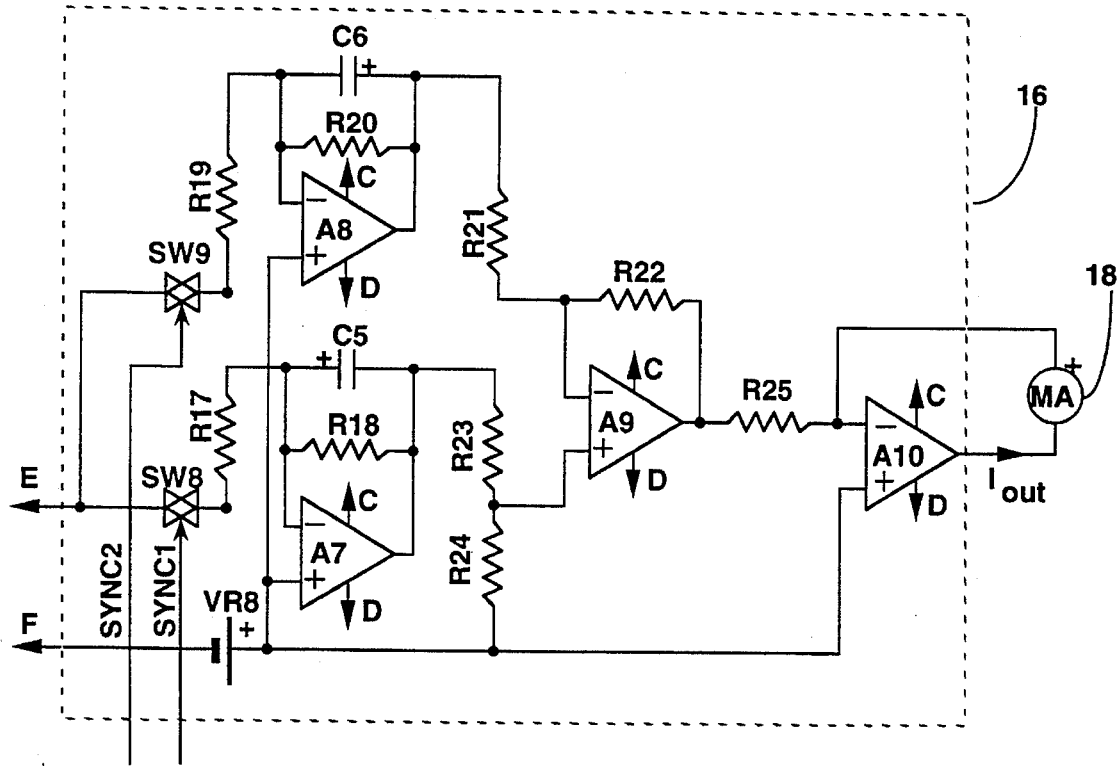

FIGS. 12a and 12b are diagrams of a synchronous detector/integrator circuit 16 and display device 18 suitable for use with either the first invention embodiment disclosed in FIGS. 4a, 4b, and 4c, or the second invention embodiment disclosed in FIGS. 8a, 8b, and 8c. FIG. 12a depicts a half-wave detector appropriate to the unilateral mode of operation of either embodiment. FIG. 12b depicts a full-wave detector appropriate to the bilateral mode of operation of either embodiment.

Consider the circuit of FIG. 12a. VR6 and VR7 are two equal reference voltages which may, e.g., be 2.5 volts. VR7 establishes the bias level of operational amplifiers A5 and A6, and VR6 offsets the input signal by the same amount so that zero input signal (between E and F) yields zero output signal. Operational amplifier A5, resistors R14 and R15, and capacitor C4 comprise an inverting/integrating amplifier. The RC time constant of this circuit is chosen to be several seconds.

Operation of the half-wave detector circuit of FIG. 12a can be explained with reference to the unilateral-mode timing diagrams of FIGS. 5 and 9. With either embodiment, a signal voltage pulse appears between terminals E and F beginning when LEVEL makes a "1" to "0" transition and ending when $\overline{\text{WINDOW}}$ makes a "0" to "1" transition. The first part of this signal is ignored since the SYNC signal is delayed by time $T_D$ to permit the signal to reach equilibrium. After time $T_D$, when SYNC goes to logic "1", switch SW7 closes. This couples the signal pulse to the input of the inverting/integrating amplifier thereby adding to the charge stored on integration capacitor C4. At the end of the enablement window, SYNC returns to "0" thus opening switch SW7.

The circuit of FIG. 12a reaches equilibrium when the charge added to C4 by each pulse is exactly balanced by the charge lost to resistor R15 during the remainder of the cycle. The output voltage of the inverting/integrating amplifier is then essentially the time-average of the output pulses taken over the previous several seconds. This averaging process contributes to the noise immunity of the circuit. The amplifier output voltage is coupled to a voltage-to-current converter comprising operational amplifier A6 and resistor R16. The output current of this voltage-to-current converter is $I_{out}$ which drives milliammeter display device 18.

FIG. 12b depicts a full-wave detector circuit appropriate to the bilateral mode of operation of either embodiment. It comprises two inverting/integrating amplifiers that are alternately enabled with alternating synchronization pulses SYNC1 and SYNC2, a differential amplifier, and a voltage to current converter. Operation of this circuit can be explained with reference to the timing diagrams of FIGS. 6, 7, 10, and 11.

With either the first embodiment or the second embodiment, alternating positive and negative signal voltage pulses, disposed about a dc bias level, appear between terminals E and F. In the case of the positive pulses, SYNC1 goes to logic "1" during the latter portion of the pulse. This enables the lower inverting/integrating amplifier comprising A7, SW8, R17, R18, and C5 thereby adding to the charge on integration capacitor C5. In the case of the negative pulses, SYNC2 goes to logic "1" during the latter portion of the pulse. This enables the upper inverting/integrating amplifier comprising A8, SW9, R19, R20, and C6 thereby adding to the charge on integration capacitor C6. The two averaged outputs are then combined in a differential amplifier which subtracts the output of the upper amplifier from the output of the lower amplifier. The differential amplifier comprises operational amplifier A9 along with equal resistors R21, R22, R23, and R24. Its output is coupled to a voltage-to-current converter comprising A10 and R25 and the resulting output current $I_{out}$ displayed on milliammeter display device 18. Enhanced noise immunity occurs with this circuit due to the fact that noise signals will tend to be added and subtracted with equal frequency and will therefore tend to cancel in pairs.

Figure 13:
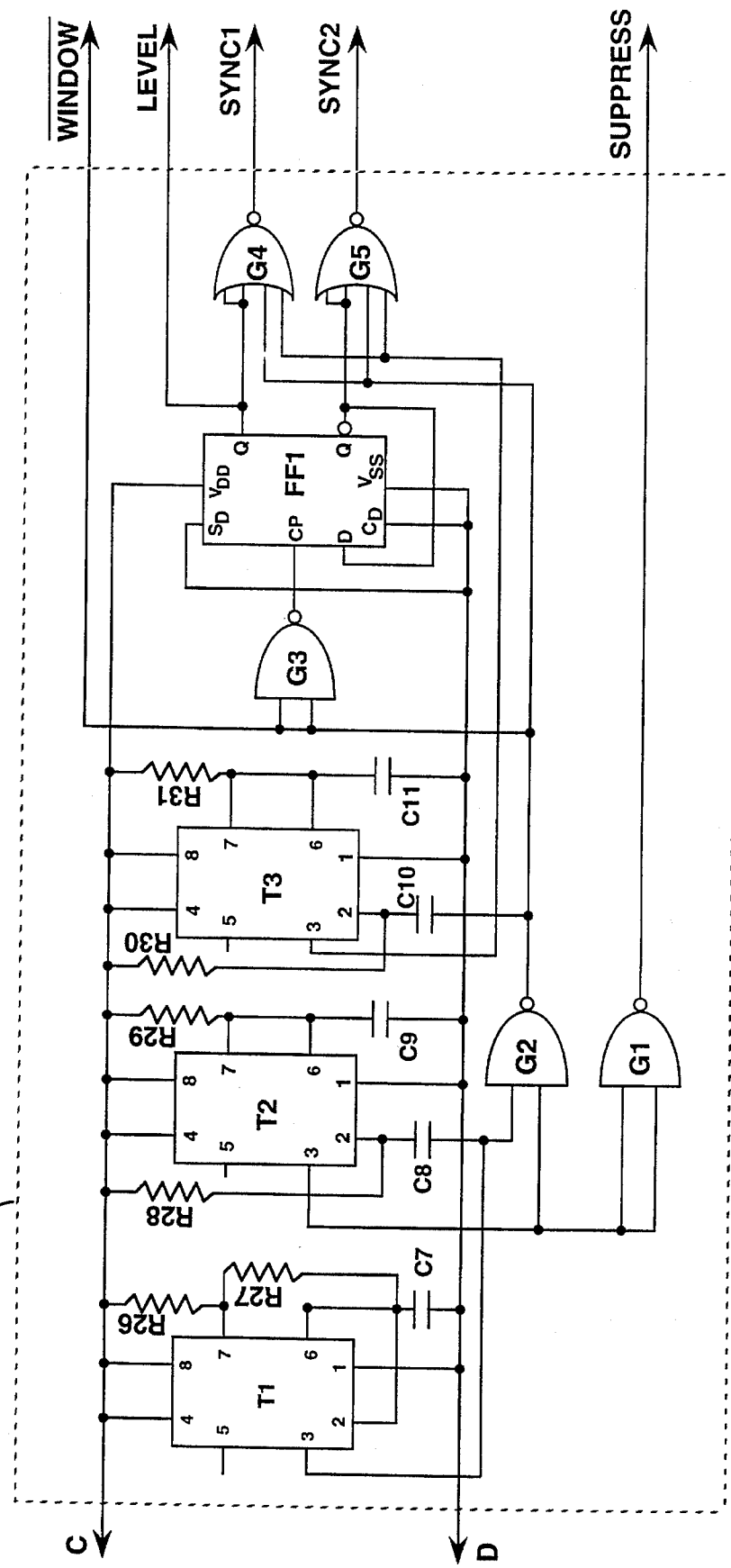
FIG. 13 is a schematic diagram of a timing module 20 suitable for use with either the first invention embodiment disclosed in FIGS. 4a, 4b, and 4c, or the second invention embodiment disclosed in FIGS. 8a, 8b, and 8c.

FIG. 13 is a schematic diagram of a timing module that can be used for bilateral operation of either the first invention embodiment disclosed in FIGS. 4a, 4b, and 4c, or the second invention embodiment disclosed in FIGS. 8a, 8b, and 8c. This circuit is included for purposes of example only; since appropriate timing signals can be generated in many alternative ways that will be apparent to one of ordinary skill in the art—including the use of a microprocessor.

The circuit of FIG. 13 utilizes three integrated circuit timers T1, T2, and T3; along with NAND gates G1, G2, and G3; NOR gates G4 and G5; and flipflop FF1 to generate the appropriate timing signals. Timers T1, T2, and T3 can, e.g., be type LM555; NAND gates G1, G2, and G3 can, e.g., be type CD4011B, NOR gates G4 and G5 can, e.g., be type CD4002, and flipflop FF1 can, e.g., be a type CD4013B integrated circuit. All of these devices are standard devices manufactured by National Semiconductor Corporation.

Timer T1 is configured as an astable or "freerunning" multivibrator with resistors R26, R27, and capacitor C7 so chosen that its output (pin 3) goes "low" every 50 mS, remaining low for the setup time $T_s$=200 µS before returning "high." The output of T1 is coupled to the trigger input (pin 2) of timer T2 via coupling network C8–R28. Accordingly, the action of the output of T1 going "low" triggers timer T2. Timer T2 is configured as a monostable or "one-shot" multivibrator with R29 and C9 so chosen that its output (pin 3) goes "high" when it is triggered; remaining "high" for a time $(T_s+T_w)$=400 µS, where $T_w$=200 µS is the window width. The output of timer T2 is simply inverted by NAND gate G1 to form the logic signal SUPPRESS. In addition, the outputs of timer T1 and timer T2 are "anded" together and inverted by NAND gate G2 to form the logic signal $\overline{\text{WINDOW}}$.

The $\overline{\text{WINDOW}}$ logic signal is inverted by NAND gate G3 and used to clock flipflop FF1. Accordingly, every time $\overline{\text{WINDOW}}$ goes "low", the output of FF1 "toggles" its state. The output of FF1 is therefore a perfect square wave with period $T_p$=100 mS—exactly twice the period of the waveform of "free-running" multivibrator, T1. Transitions of the output of FF1 are delayed from the "high"-to-"low" transitions of $\overline{\text{WINDOW}}$ by the very short time comprising propagation delays of G3 and FF1. The Q output signal of FF1 forms the logic signal LEVEL.

The $\overline{\text{WINDOW}}$ logic signal is coupled to the trigger input (pin 2) of timer T3, configured as a "oneshot" multivibrator, by capacitor C10 and resistor R30. Accordingly, every time that $\overline{\text{WINDOW}}$ goes "low", pin 3 of T3 goes "high", remaining "high" for a time determined by C11 and R31 before returning "low." This time is the detector delay time, $T_D$=50 µS. The output of timer T3 is combined with $\overline{\text{WINDOW}}$ and with the direct and inverted outputs of flipflop FF1 in NOR gates G4 and G5. The outputs of NOR gates G4 and G5 comprise the two logic signals SYNC1 and SYNC2 used for detector synchronization.

Although a specific mode for carrying out the present invention has been herein described, it is to be understood that modification and variation can be made without departing from what is regarded to be the subject matter of the invention. All such modifications and variations are believed to be within the scope of the invention and are intended to be covered by the appended claims.

What is claimed is:

1. An electronic circuit with an output signal containing a component proportional to an element of conductance of an electrochemical cell or battery comprising:

high-gain amplifier means including power amplifying output means providing said output signal;

internal feedback means, including logic-controlled switch means and holding capacitor means, said internal feedback means coupling said output signal to the input of said high-gain amplifier means and said holding capacitor means instantaneously following said output signal when said logic-controlled switch means is in a first state, said internal feedback means not coupling said output signal to said input of said high-gain amplifier means and said holding capacitor means storing a fixed voltage when said logic-controlled switch means is in a second state;

external feedback means, including feedback resistor means, coupling said output signal to said electrochemical cell or battery;

voltage sourcing means providing logic-selectable discrete voltage levels;

capacitive coupling means coupling the series combination of said electrochemical cell or battery and said voltage sourcing means to said input of said high-gain amplifier means; and, timing means coupled to said logic-controlled switch means and to said voltage sourcing means, said timing means directing said voltage sourcing means to periodically step-change between said discrete voltage levels, and also directing said logic-controlled switch means to assume said second state immediately before said step-change and to assume said first state at a given time after said step-change.

2. An electronic circuit according to claim 1 wherein said high-gain amplifier means includes a voltage reference means for providing an offset bias level to said output signal.

3. An electronic circuit according to claim 1 wherein said timing means only directs said logic-controlled switch means to assume said second state immediately before step changes of said voltage sourcing means which are either all low-to-high transitions or all high-to-low transitions between said discrete voltage levels.

4. An electronic circuit according to claim 1 wherein said timing means directs said logic-controlled switch means to assume said second state immediately before step changes of said voltage sourcing means which include both low-to-high transitions and high-to-low transitions between said discrete voltage levels.

5. An electronic circuit according to claim 1 wherein said internal feedback means further includes a bucking voltage means and a logic-controlled insertion means coupled to said timing means, said logic-controlled insertion means directed by said timing means to insert said bucking voltage means into said internal feedback means while said logic-controlled switch means is in said first state.

6. An electronic circuit according to claim 1 wherein said timing means comprises microprocessor means.

7. An electronic circuit with an output signal containing a component proportional to an element of resistance of an electrochemical cell or battery comprising:

amplifier means providing said output signal;

logic-controlled switch means connected across the input of said amplifier means thereby short-circuiting said input when said logic-controlled switch means is in a first state and not short-circuiting said input when said logic-controlled switch means is in a second state;

coupling network means including holding capacitor means coupling a signal across said electrochemical cell or battery to the input of said amplifier means, said holding capacitor means instantaneously following the voltage of said electrochemical cell or battery when said logic-controlled switch is in said first state and storing a fixed voltage when said logic-controlled switch is in said second state;

current sourcing means coupled to said electrochemical cell or battery and providing logic-selectable discrete current levels, and, timing means coupled to said logic-controlled switch means and to said current sourcing means, said timing means directing said current sourcing means to periodically step-change between said discrete current levels, and also directing said logic-controlled switch means to assume said second state immediately before said step-change and to assume said first state at a given time after said step-change.

8. An electronic circuit according to claim 7 wherein said coupling network means includes a voltage reference means for providing an offset bias level to said output signal.

9. An electronic circuit according to claim 7 wherein said timing means only directs said logic-controlled switch means to assume said second state immediately before step changes of said current sourcing means which are either all low-to-high transitions or all high-to-low transitions between said discrete current levels.

10. An electronic circuit according to claim 7 wherein said timing means directs said logic-controlled switch means to assume said second state immediately before step changes of said current sourcing means which include both low-to-high transitions and high-to-low transitions between said discrete current levels.

11. An electronic circuit according to claim 7 wherein said current sourcing means includes logic-controlled current suppression means coupled to said timing means, said logic-controlled current suppression means directed by said timing means to suppress current through said electrochemical cell or battery during times that said logic-controlled switch means is in said first state.

12. An electronic circuit according to claim 7 wherein said timing means comprises microprocessor means.

* * * * *